United States Patent
Chen

(10) Patent No.: US 6,747,904 B2
(45) Date of Patent: Jun. 8, 2004

(54) LEAKAGE CONTROL CIRCUIT

(75) Inventor: Chih-Jen Chen, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 11 days.

(21) Appl. No.: 10/318,713

(22) Filed: Dec. 13, 2002

(65) Prior Publication Data

US 2004/0080987 A1 Apr. 29, 2004

(30) Foreign Application Priority Data

Oct. 24, 2002 (TW) ...................................... 91124767 A

(51) Int. Cl.[7] .................................................. G11C 7/00
(52) U.S. Cl. .................. 365/189.09; 365/207; 365/226; 365/230.06
(58) Field of Search ............................ 365/189.09, 207, 365/226, 230.06; 327/535, 536, 537, 538

(56) References Cited

U.S. PATENT DOCUMENTS

| | | | | |
|---|---|---|---|---|
| 5,337,284 A | * | 8/1994 | Cordoba et al. | ............ 365/227 |
| 5,553,295 A | * | 9/1996 | Pantelakis et al. | ........... 365/226 |
| 5,946,258 A | * | 8/1999 | Evertt et al. | ................ 365/226 |
| 5,969,565 A | * | 10/1999 | Naganawa | ................... 365/226 |
| 6,597,235 B2 | * | 7/2003 | Choi | .......................... 327/536 |
| 2002/0064077 A1 | * | 5/2002 | Kobayashi et al. | ......... 365/226 |
| 2002/0125936 A1 | * | 9/2002 | Matsuoka | ................... 327/536 |
| 2003/0058693 A1 | * | 3/2003 | Marotta | ................. 365/189.09 |

\* cited by examiner

*Primary Examiner*—VanThu Nguyen
(74) *Attorney, Agent, or Firm*—Quintero Law Office

(57) ABSTRACT

A leakage control circuit and DRAM equipped therewith. The leakage control circuit includes a differential amplifier, a first voltage divider, a second voltage divider, MOS transistors, and a charge pump. The first voltage divider generates a first reference voltage. The second voltage divider generates a second reference voltage. The differential amplifier has a first input receiving the first reference voltage, a second input receiving the second reference voltage, and an output coupled to the input of the charge pump. MOS transistors have drains coupled to the first input of the differential amplifier, gates coupled to the output of the charge pump, and sources coupled to a ground potential.

12 Claims, 3 Drawing Sheets

LEAKAGE CONTROL CIRCUIT

BACKGROUND OF THE INVENTION

1. Field of the Invention

The present invention relates to a leakage control circuit, and particularly to a leakage control circuit applied in dynamic random access memories.

2. Description of the Related Art

In order to preserve power consumption and propagation delay, power supplies and threshold voltages are reduced with scaling of the CMOS process. Reductions of the threshold voltages, however, result in sub-threshold leakage currents significantly, so high density memories, such as dynamic random access memories, consume more power and have short retention time.

In deep submicron CMOS process, short channel effect is significant, depletion layers of drains and sources overlap much more, and parasitic bipolar junction transistor of drain-gate-source in MOS transistor enhances the sub-threshold leakage currents.

A fixed reverse bias is applied to substrates, adopted in the prior art, to increase threshold voltage to turn off MOS transistors. In deep submicron CMOS process, this is not sufficient to turn off MOS transistors completely. There is a need for a novel leakage control circuit.

SUMMARY OF THE INVENTION

It is therefore an object of the present invention to. prevent leakage currents in MOS transistors, and particularly to turn off switch MOS transistors in a dynamic random access memory.

To achieve the above objects, the present invention provides a leakage control circuit for a dynamic random access memory.

The leakage control circuit includes MOS transistors for monitoring leakage currents, a differential amplifier, resistors, the first, second, third, and fourth resistors, a charge pump, and a word-line driver. The MOS transistors for. monitoring leakage currents are fabricated by the same process, which fabricates the switch MOS transistors in memory cell. The first resistor and the second resistor are in series to form a first voltage divider. The first reference voltage is generated at the junction of the first divider and coupled to the non-inverting input of the differential amplifier. The third resistor and the fourth resistor form a second voltage divider. The second reference voltage is generated at the junction of the second divider and coupled to the inverting input of the differential amplifier. The output of the differential amplifier is coupled to an input of an inverter. The output of the inverter is coupled to an enable terminal of the charge pump. The output of the charge pump is coupled to the word line driver and gates of the MOS transistor, and generates a second voltage.

When the leakage currents in the MOS transistors for monitoring leakage currents are below tolerance, the charge pump is inactive, the second voltage remains at a fixed voltage. When the leakage currents in the MOS transistors for monitoring leakage currents are above tolerance, the charge pump is active, and the second voltage is pulled down with a non-overlap clock signal.

With the second voltage is pulled down, the leakage current in the MOS transistor is reduced. Until the leakage current is less than the tolerance, the charge pump is inactive, and the second remains fixed again.

BRIEF DESCRIPTION OF THE DRAWINGS

The aforementioned objects, features and advantages of this invention will become apparent by referring to the following detailed description of the preferred embodiment with reference to the accompanying drawings, wherein.

DETAILED DESCRIPTION OF THE INVENTION

Figure 1:
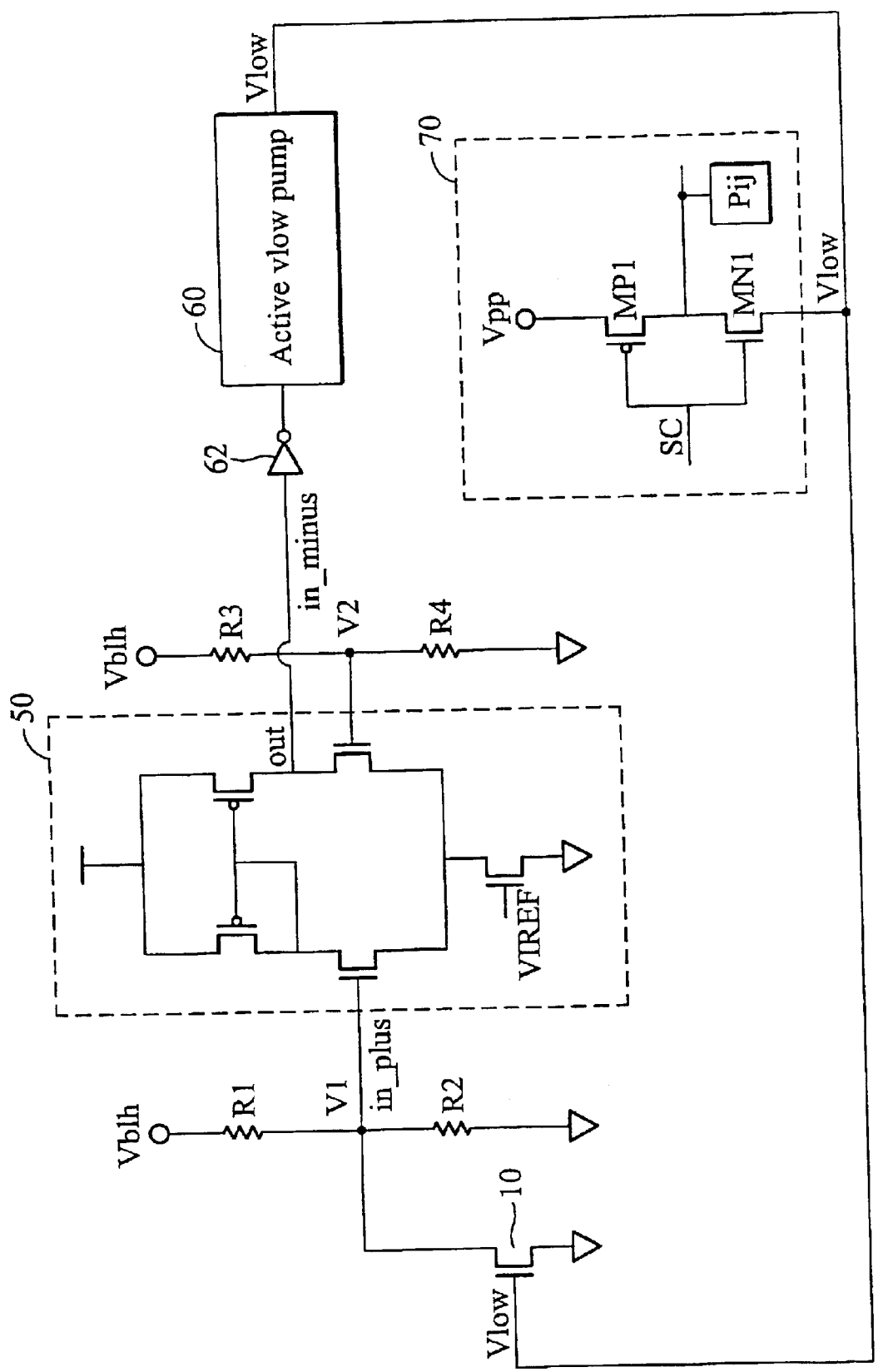
FIG. 1 shows a leakage control circuit in the embodiment.

FIG. 1 shows a leakage control circuit in the embodiment. The leakage control circuit includes MOS transistors 10, a differential amplifier 50, resistors R1, R2, R3, R4, and a charge pump 60. The resistors R1 and R2 form a first voltage divider. The resistors R3 and R4 form a second voltage divider.

MOS transistors 10 are coupled between the non-inverting input in_plus of the differential amplifier 50 and the ground. The resistor R1 is coupled to the first voltage Vblh. The junction of the resistor R1 and resistor R2 is coupled to the the non-inverting input in_plus of the differential amplifier 50. The other end of the resistor R2 is coupled to a low voltage, the ground. The resistor R3 is coupled to the first voltage Vblh. The junction of the resistor R3 and resistor R4 is coupled to the the inverting input in_minus of the differential amplifier 50. The other end of the resistor R2 is coupled to the ground.

The output of the differential amplifier 50 is coupled to an input of the inverter 62. The output of the inverter 62 is coupled to an enable terminal of the charge pump 60. The output of the charge pump 60 generates a second voltage Vlow. The source of the MOS transistor MN1 in the word line driver 70 is coupled to the second voltage. The gates of the MOS transistors 10 are coupled to the second voltage.

Figure 2:
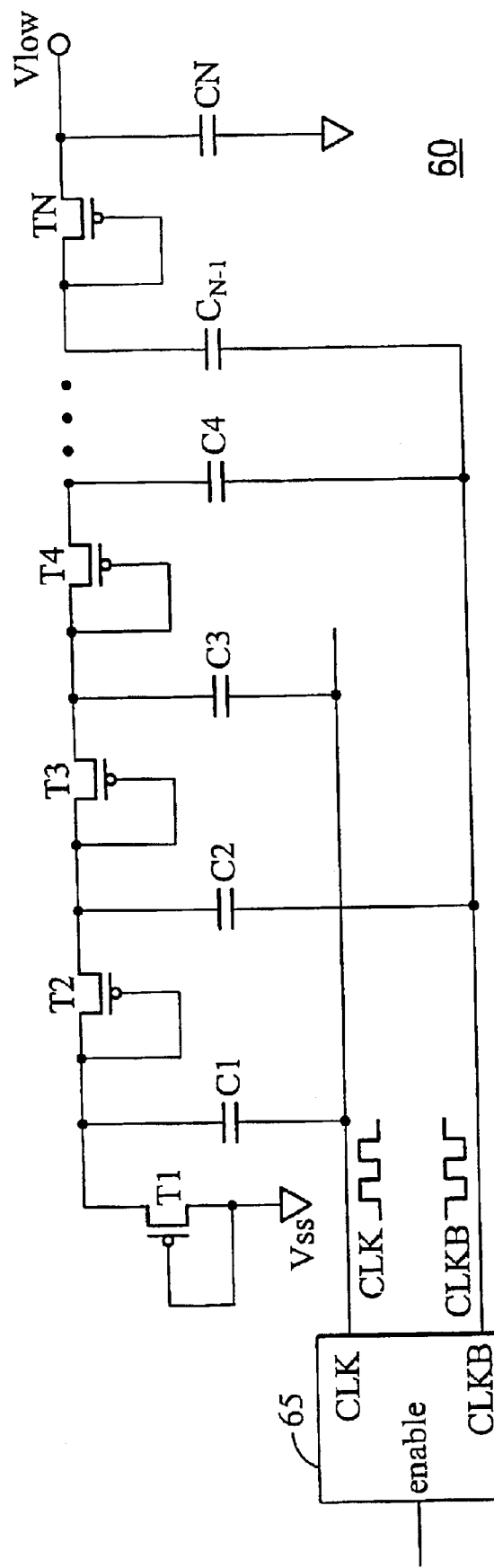
FIG. 2 shows a schematic diagram of the charge pump.

FIG. 2 shows a schematic diagram of the charge pump 60. As shown in FIG. 2, the enable terminal of the clock control circuit 65 receives the output signal of the inverter 62, determining whether the clock signal CLK and the inverting clock signal CLKB are output. The rising and falling edges of the clock signal CLK and the inverting clock signal CLKB are non-overlapping. The output terminal of the charge pump 60 is coupled to a series of N-stage transistor-capacitor, Ti, Ci $1 \leq i \leq N$, to form a N-stage voltage multiplier. The transistors Ti and capacitors Ci couple the clock signal CLK and the inverting clock signal CLKB alternatively, the odd number transistor-capacitor receives the clock signal CLK, and the even transistor-capacitor receives the inverting clock signal CLKB. The transistor-capacitors, Ti, Ci, discharge successively at falling edges of the clock signal CLK and the inverting clock signal CLKB thereby pulling down the second voltage Vlow with time.

Figure 3:
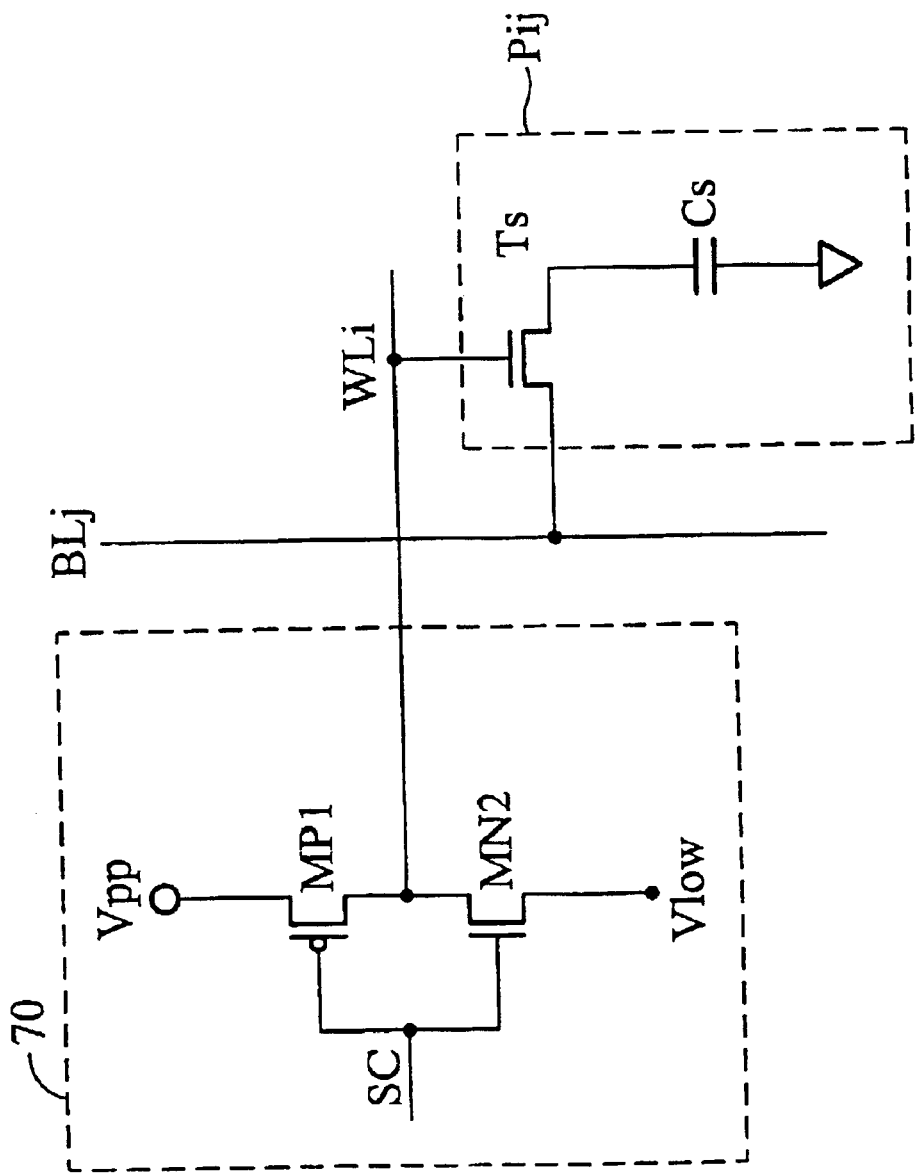
FIG. 3 shows a schematic of the DRAM.

FIG. 3 shows a schematic of the DRAM. The memory cell Pij is located at an intersection of the word line WLi and the bit line BLj. The memory cell includes a MOS transistor Ts and a storage capacitor Cs. The gate of the MOS transistor Ts is coupled to the word line WLi. The MOS transistor Ts is coupled between the storage Cs and the bit line BLj. In a write cycle, the written data is 1 and the control signal SC is at a low level, so the word line WLi is coupled to the high voltage source Vpp, turning on the MOS transistor Ts and charging the storage capacitor Cs up to a voltage VBL. At the end of the write cycle, the control signal SC is at a high level, and the word line WLi is coupled to the second voltage Vlow, turning off the MOS transistor Ts.

When the MOS transistor Ts is turned off, the leakage currents still discharge the storage capacitor Cs. The tolerance voltage of the memory cell is V. The retention time of the memory cell Pij is t. The tolerance sub-threshold current is Ia.

$$Q=CV=Ia*t$$

The MOS transistor 10 is fabricated by the same process as the MOS transistor Ts. The MOS transistor monitors leakage currents in the MOS transistors Ts of memory cells and control the enable terminal of the charge pump 60. The number of MOS transistors 10 adjusts sensitivity of the leakage control. circuit. When the number of MOS transistors 10 is large, leakage control circuit response is fast. When the number is small, response is slow.

The resistors R1, R3, and R4 have the same resistance R. The resistance of the resistor $R_2$ is $R+\Delta R$. When the leakage currents in the MOS transistors 10 are below tolerance, the voltage V1 of the junction in_plus of the resistor R1 and resistor R2 is $Vblh*((R+\Delta R)/(2R+\Delta R))>Vblh/2$. The voltage V2 of the junction in_minus of the resistor R3 and resistor R4 is $Vblh* (R/2R)=Vblh/2$. The voltage V1 is greater than the voltage V2, so the output of the differential amplifier 50 is at a high level. The output of the inverter 62 is at a low level. The charge pump 60 is inactive, the second voltage Vlow remains at a fixed voltage.

When the leakage currents in the MOS transistors 10 are above tolerance, the voltage V1 is less than the voltage $V2=Vblh*(R/2R)$. The leakage current I in the MOS transistor 10 must satisfy $$(\tfrac{1}{2})*Vblh/R=(\tfrac{1}{2})*Vblh/(R+\Delta R)+I$$

$$N=I/Ia.$$

The output out of the differential amplifier 50 is at a low voltage level. The output of the inverter 62 is at a high voltage level. The charge pump 60 is active. The second voltage Vlow is pulled down with the clock signal CLK and the inverting clock signal CLKB. The voltage at the gates of the MOS transistor 10 is pulled down.

With the second voltage Vlow pulled down, the leakage current in the MOS transistor 10 is reduced. Until the leakage current is less than the tolerance, the voltage V1 is greater than the voltage V2. The output of the differential amplifier 50 is at a high level. The output of the inverter 62 is at a low level. The charge pump 60 is inactive, and the second voltage Vlow remains fixed again.

The advantages of the present invention are as follows.

The MOS transistors, fabricated by the same process as the memory cell, sense leakage current. The number of the MOS transistors is determined by the sensitivity and the layout area.

The negative voltage is adjusted by negative feedback to sufficiently turn off the leakage currents.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A leakage control circuit for a random access memory having word line drivers, bit lines, word lines, and memory cells, wherein the word line drivers are coupled to a second voltage, have inputs for receiving a control signal, and have outputs coupled to corresponding word lines, the memory cells have storage capacitors and MOS transistors, and the gates of the MOS transistors are coupled to corresponding word lines, the leakage control circuit comprising:

a differential amplifier having a first input, a second input, and an output, wherein the first input receives a first reference voltage, and the second input receives a second reference voltage;

a first divider receiving a first voltage to generating the first reference voltage;

a second divider receiving a first voltage to generating the second reference voltage;

MOS transistors having drains, gates, and sources, wherein drains of the MOS transistors are coupled to the first input of the differential amplifier, and the MOS transistors are fabricated by the same process as the MOS transistors in the memory cells; and a charge pump having an enable terminal and an output, wherein the enable terminal of the charge pump is coupled to the output of the differential amplifier, and the output of the charge pump generates the second voltage and is coupled to the gates of the MOS transistors.

2. The leakage control circuit as claimed in claim 1, wherein, when leakage currents in the MOS transistors are above a threshold current, the first reference voltage is below the second reference voltage, the charge pump is activated by the enable terminal, and the second voltage is pulled down.

3. The leakage control circuit as claimed in claim 1, wherein when leakage currents in the MOS transistors are below a threshold current, the first reference voltage is above the second reference voltage, the charge pump is deactivated by the enable terminal, and the second voltage remains fixed.

4. The leakage control circuit as claimed in claim 1, wherein:

the first voltage divider includes a series of resistors, a first resistor and a second resistor, the first resistor is coupled to the first voltage, the second resistor is coupled to a low voltage, the first reference voltage is generated at a junction of the first resistor and the second resistor; and the second voltage divider includes a series of resistors, a third resistor and a fourth resistor, the third resistor coupled to the first voltage, the second resistor coupled to the low voltage, and the second reference voltage generated at a junction of the third resistor and the fourth resistor.

5. The leakage control circuit as claimed in claim 4, wherein the first resistor, the third resistor, and the fourth resistor all have a first resistance, the second resistor has a second resistance, and the second resistance is above the first resistance.

6. A random access memory with a leakage control circuit comprising:

a differential amplifier having a first input, a second input, and an output, wherein the first input receives a first reference voltage, and the second input receives a second reference voltage;

a first divider receiving a first voltage to generate the first reference voltage;

a second divider receiving a first voltage to generate the second reference voltage;

MOS transistors having drains, gates, and sources, wherein drains of the MOS transistors are coupled to the first input of the differential amplifier, and the MOS transistors are fabricated by the same process as the MOS transistors in the memory cells;

a charge pump having an enable terminal and an output, wherein the enable terminal of the charge pump is coupled to the output of the differential amplifier, and the output of the charge pump generates the second voltage and is coupled to the gates of the MOS transistors; and a word line driver having an input and an output and coupled between a high voltage and the output of the charge pump, wherein the output of the word line driver is coupled to the second voltage according to the input.

7. The random access memory as claimed in claim 6, wherein when leakage currents in the MOS transistors are above a threshold current, the first reference voltage is below the second reference voltage, the charge pump is activated by the enable terminal, and the second voltage is pulled down.

8. The random access memory as claimed in claim 6, wherein when leakage currents in the MOS transistors are below a threshold current, the first reference voltage is above the second reference voltage, the charge pump is deactivated by the enable terminal, and the second voltage remains fixed.

9. The random access memory as claimed in claim 6, wherein:

the first voltage divider includes a series of resistors, a first resistor and a second resistor, the first resistor is coupled to the first voltage, the second resistor is coupled to a low voltage, the first reference voltage is generated at a junction of the first resistor and the second resistor; and the second voltage divider includes a series of resistors, a third resistor and a fourth resistor, the third resistor is coupled to the first voltage, the second resistor is coupled to the low voltage, the second reference voltage is generated at a junction of the third resistor and the fourth resistor.

10. The random access memory as claimed in claim 6, wherein the first resistor, the third resistor, and the fourth resistor all have a first resistance, and the second resistor has a second resistance higher than the first resistance.

11. The random access memory as claimed in claim 6, further comprising word lines, bit lines, and memory cells, wherein the memory cells are disposed at intersections of the word lines and bit lines.

12. The random access memory as claimed in claim 6, wherein each memory cell has a storage capacitor and a MOS transistor, and the gate of the MOS transistor is coupled to the word line driver, and the MOS transistor is coupled between the bit line and the storage capacitor.

* * * * *